(12) United States Patent
Fortin et al.

(10) Patent No.: US 9,964,593 B1
(45) Date of Patent: May 8, 2018

(54) BOUNDARY SCAN RECEIVER

(71) Applicant: Cadence Design Systems, Inc., San Jose, CA (US)

(72) Inventors: Guillaume Fortin, Montreal (CA); Eva Sokolowska, Roxboro (CA); Marek Barszcz, Roxboro (CA)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days. days.

(21) Appl. No.: 15/423,040

(22) Filed: Feb. 2, 2017

(51) Int. Cl.
*G01R 31/28* (2006.01)
*G01R 31/3177* (2006.01)
*H03K 5/1534* (2006.01)
*G01R 31/317* (2006.01)

(52) U.S. Cl.
CPC ... *G01R 31/3177* (2013.01); *G01R 31/31703* (2013.01); *G01R 31/31705* (2013.01); *G01R 31/31706* (2013.01); *G01R 31/31727* (2013.01); *H03K 5/1534* (2013.01)

(58) Field of Classification Search
CPC ........ G01R 31/31703; G01R 31/31705; G01R 31/31706; G01R 31/3177; G01R 31/31727; G01R 31/318385; G01R 31/318541; G01R 31/318586; G01R 31/31921; G01R 31/3193; G01R 31/31926; H03K 5/1534

USPC ....... 714/727, 745, 726, 728, 729, 724, 732, 714/733, 734, 736, 703

See application file for complete search history.

(56) References Cited

U.S. PATENT DOCUMENTS

| 5,544,174 A * | 8/1996 | Abend ............... G01R 31/2815 714/32 |
| 5,835,506 A * | 11/1998 | Kuglin ............. G01R 31/31921 714/724 |
| 2011/0078522 A1* | 3/2011 | Suzuki ........... G01R 31/318385 714/724 |

* cited by examiner

*Primary Examiner* — Christine T. Tu
(74) *Attorney, Agent, or Firm* — Andrews Kurth Kenyon LLP

(57) ABSTRACT

A system, method, and circuits for processing a boundary scan result involve receiving the boundary scan result as input data to a comparator, and performing a comparison based on the input data and a selected reference level to form a comparison result. A capture device that stores the comparison result is set, reset or write enabled based on the comparison result and a reference value indicating which of two reference levels is the selected reference level. Additionally, a determination is made whether to change the selected reference level for a subsequent comparison based on the comparison result, the reference value, and the output of the capture device.

20 Claims, 5 Drawing Sheets

| Inputs | | | Outputs | | |
|---|---|---|---|---|---|
| Reference Selection | Comparator Output | JTAG Output | Next Reference Selection | set_n | reset_n |
| 0 | 0 | 0 | 0 | 1 | 0 |
| 0 | 0 | 1 | 0 | 1 | 0 |
| 0 | 1 | 0 | 1 | 1 | 1 |
| 0 | 1 | 1 | 0 | 1 | 1 |
| 1 | 0 | 0 | 1 | 1 | 1 |
| 1 | 0 | 1 | 0 | 1 | 1 |
| 1 | 1 | 0 | 1 | 0 | 1 |
| 1 | 1 | 1 | 1 | 0 | 1 |

| Inputs | | | | Outputs | | |
|---|---|---|---|---|---|---|
| Reference Selection | Comparator Output | Delayed Output Of Comparator | JTAG Output | Next Reference Selection | set_n | reset_n |
| 0 | 0 | 0 | 0 | 0 | 1 | 0 |
| 0 | 0 | 0 | 1 | 0 | 1 | 0 |
| 0 | 0 | 1 | 0 | 0 | 1 | 1 |
| 0 | 1 | 0 | 1 | 0 | 1 | 1 |
| 0 | 1 | 1 | 0 | 0 | 1 | 1 |
| 0 | 1 | 0 | 1 | 1 | 1 | 1 |
| 1 | 0 | 0 | 0 | 0 | 1 | 1 |
| 1 | 0 | 1 | 1 | 1 | 1 | 1 |
| 1 | 0 | 0 | 0 | 0 | 1 | 1 |
| 1 | 1 | 1 | 1 | 1 | 1 | 1 |
| 1 | 1 | 0 | 0 | 1 | 0 | 1 |
| 1 | 1 | 1 | 1 | 1 | 0 | 1 |

FIG. 3

BOUNDARY SCAN RECEIVER

FIELD OF THE INVENTION

This description relates to methods and circuits for receiving and processing results of a boundary scan.

BACKGROUND

Boundary scan refers to a technique for testing a circuit to detect problems with interconnects and circuit components. Detected problems include open or short circuits, dead or missing components, and faulty integrated circuit blocks. Boundary scan is performed by driving a test signal onto an interconnect being tested, and reading the output of a boundary scan receiver located at the far-end of the interconnect. The output may indicate that the path between the input pin and the output pin is open, shorted, or faulty, e.g., when the value or values of the output signal are not as expected based on the test signal. The interconnect attached to each input pin of the circuit may be tested in this manner, with appropriate test signals or test patterns being applied.

Boundary scan has been developed by the Joint Test Action Group ("JTAG") and is incorporated into the Institute of Electrical and Electronics Engineers ("IEEE") standard 1149.6. The standard provides for the testing of circuits that use differential signaling and alternating current ("AC") coupling. AC and direct current ("DC") testing modes are both supported. On the input side, the test circuit is referred to as a driver. On the output side, the test circuit is referred to as a receiver. In the AC mode, the receiver reconstructs the signal sent by the transmitter by detecting positive and negative edges. AC detection involves comparing the output against two thresholds (a positive threshold and a negative threshold) to identify when the output crosses either threshold. AC detection may be performed, for example, using two comparators—one with a reference level corresponding to the positive threshold and another one with a reference level corresponding to the negative threshold. In the DC mode, the receiver directly detects the signal level of the output, also using a threshold comparison, but without detecting edges. In IEEE 1149.6, the receiver includes an output capturing device in the form of a flip-flop that is initialized by presetting the flip-flop to a known value.

A receiver according to IEEE 1149.6 may include a flip-flop whose set and reset (clear) inputs are separately controlled by an output of a corresponding comparator. The output of the flip-flop, which is also the output of the receiver, will depend on how the flip-flop is set and reset by the comparators. The comparators may each have a first data input connected to an input of the receiver through respective offset voltages. The offset voltages determine the reference levels of the comparators and provide voltage hysteresis. Second data inputs of the comparators may be connected to a delayed and low pass filtered version of the input. In the AC mode, the comparators are not connected to a fixed voltage reference. Instead, the low-pass filter essentially provides an average history of the input, against which history the current input is compared.

The receiver described above can be modified to support DC mode by adding a switch that disconnects the low pass filter to instead connect a fixed reference voltage to the second data inputs of the comparators, and by changing the voltage offsets to a value suitable for DC level detection. In the AC mode, the comparators would need to compare the input voltage for a minimum period of time known as a hysteresis delay. The hysteresis delay is chosen to be significantly longer than the expected transition time of the input. Each comparator should output a decision (logic level 1 or 0) only after this minimum period has elapsed. If the input was continuously greater than the reference voltage plus the offset voltage, the comparator outputs a 1. If the input was continuously less than the reference voltage minus the offset voltage, the comparator outputs a 0. If the input is in-between these two reference levels (i.e., less than the reference voltage plus the offset voltage, and greater than the reference voltage minus the offset voltage), the comparator maintains its current output state.

A differential boundary scan test setup may include a differential driver that is AC coupled to a receiver unit. The driver is connected to an input pin of a circuit being tested and the receiver unit is connected to a corresponding output pin of the circuit. Each polarity of a differential AC signal output by the circuit being tested in response to the driver forms an input to a corresponding receiver circuit in the receiver unit. The outputs of these receiver circuits together form a differential digital output that could be analyzed for circuit errors. If the individual receiver circuits are the same as the IEEE 1149.6 receiver described above, then two comparators would be needed for each polarity of the differential AC signal, four comparators in total.

BRIEF DESCRIPTION OF THE DRAWINGS

FIGS. 2 and 3 each show a truth table for reference selection according to a different embodiment.

DESCRIPTION OF EMBODIMENTS

Example embodiments are described which involve test receivers that use a single, shared comparator for processing boundary scan results. Using a single comparator reduces the area of the receiver circuit compared to a conventional, two comparator approach. In both AC and DC modes, the comparator is controllable to detect whether the input is above an upper threshold, below a lower threshold, or in between.

An example test receiver is switchable between AC and DC modes. To support the use of different reference levels by the shared comparator, reference selection logic is applied to select an appropriate reference level for subsequent comparisons based on the output of the receiver and the output of the comparator. The reference selection logic includes logic and delay elements to control the timing of changes in reference level, in addition to controlling the timing of the set and reset inputs of a capture device that produces the receiver output.

Figure 1:
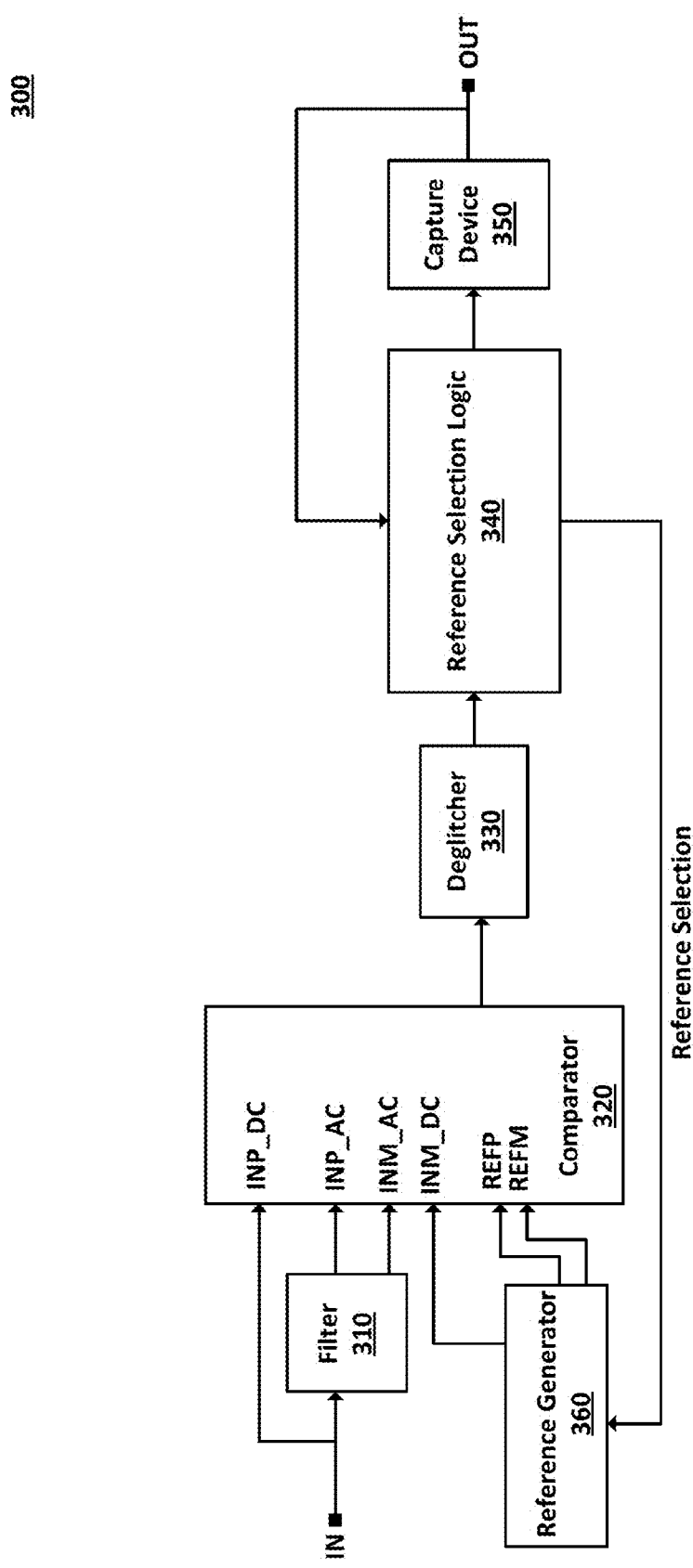
FIG. 1 shows a block diagram of a test receiver according to an embodiment.

FIG. 1 shows a block diagram of a test receiver 300 according to an embodiment. The receiver includes a filter 310, a comparator 320, a deglitcher 330, reference selection logic 340, a capture device 350, and a reference generator 360. Receiver 300 receives an input "IN" corresponding to a boundary scan result. The input IN may be a single-ended AC or DC input. Alternatively, the input IN may be a first polarity of a differential AC or DC input.

Filter 310 operates on the input IN and may be implemented using a high-pass filter instead of a low pass filter.

If a low pass filter were used, the filter would supply an RC delayed input to the comparator when the receiver is configured for edge detection (AC mode). In that case, both of the AC inputs (the input data and the delayed input data) may swing between positive and negative. Therefore, the comparator 320 would need to perform the differentiation of its AC data inputs over a common mode range of twice the amplitude of the input signal, centered around a DC termination point. This large input common mode range would add complexity to the design of the comparator. In contrast, a high-pass filter permits the comparator 320 to have one of its inputs maintained at a constant value. For example, a negative AC input of the comparator can be tied to a reference voltage. The design of the comparator can thus be simplified.

In the AC mode, the filter 310 provides an AC-coupled input for the comparator 320, in particular a positive AC input "INP_AC" can be formed by capacitively coupling the input data IN so that the AC component of IN is transmitted, while blocking a DC component. The AC coupling generates a pulse signal on INP_AC for every transition (high level to low level or vice versa) of the input data IN. A negative AC input "INM_AC" operates as an offset to the positive AC input INP_AC. INP_AC and INM_AC form a differential input to the comparator 320. The comparator 320 compares the difference of INP_AC minus INM_AC to a selected reference level. The reference level corresponds to the difference of a first reference signal "REFP" minus a second reference signal "REFM". If the difference of INP_AC minus INM_AC is greater than the reference level, the comparator outputs a logical "1". If the difference of INP_AC minus INM_AC is less than the reference level, the comparator outputs a logical "0".

The reference generator 360 produces the reference signals REFP and REFM under the control of a reference selection signal from the reference selection logic 340. REFP and REFM determine the comparator's reference level and may produce any differential value between Vdd and minus Vdd. The reference selection signal selects whether a high or low reference level is supplied to the comparator.

In the DC mode, the filter 310 is bypassed and the input signal from the primary input IN is fed directly to the positive DC input "INP_DC" of the comparator 320, while a negative DC input "INM_DC" of the comparator 320 is supplied by the reference generator 360. In DC mode, the reference level of the comparator is determined by REFP and REFM, with INM_DC operating as an offset to the positive DC input INP_DC. If the difference of INP_DC minus INM_DC is greater than REFP minus REFM, the comparator outputs a logical "1". If the difference of INP_DC minus INM_DC is less than REFP minus REFM, the comparator outputs a logical "0". The reference generator 360 produces REFP, REFM, and INM_DC under the control of the reference selection logic 340.

The deglitcher 330 includes digital logic that removes erroneous spikes in the output of comparator 320. If the comparator output suddenly changes to an opposite value (e.g., from 1 to 0 and quickly back to 1), the deglitcher 330 rejects the change, blocking it from being observed by the reference selection logic 340. The deglitcher may be configured to block pulses that are shorter than a hysteresis delay "$T_{hyst}$".

The reference selection logic 340 controls the reference generator 360 to produce the DC and AC reference signals (INM_DC, REFP and REFM) based on a digital reference value. The reference selection logic 340 decides the next reference selection value to use based on the current reference selection value, the current value of the comparator output, and a delayed output of the comparator. The reference selection logic 340 may obtain the historical output by evaluating an output "OUT" of the capture device 350. The capture device output is also referred to herein as a "JTAG output".

The reference selection logic 340 passes the deglitched comparator output to the capture device 350, which may be a flip-flop or other memory element. The reference selection logic 340 may control set and reset inputs of the capture device 350 so that OUT corresponds to the output of the comparator 320 when certain conditions are met. For example, if the comparator output is 1 and the reference selection has been set at a proper value, the reference selection logic 340 will set the capture device so that it outputs a 1. Similarly, if the comparator output is 0 and the reference selection has been set at a proper value, the reference selection logic 340 will reset the capture device. Thus, the reference selection logic 340 may control the capture device 350 in the manner of an SR latch, except when loading an initial value into the capture device. However, as explained below, the current state of the capture device does not always match the current state of the comparator output.

Switching between reference levels requires precise timing. The need to have the comparator evaluating for the entire hysteresis delay period $T_{hyst}$ means the reference level should not be changed unless the comparator has produced the same output for a period of at least $T_{hyst}$ and the comparator output has stabilized. Propagation delays in the various circuit elements should be taken into consideration, including internal delays within the comparator 320, such as the length of time required to produce a new, valid comparator output when the reference level is changed.

Controlling the output of the capture device 350 also requires precise timing. Because of the above noted delays, OUT and the comparator output are not necessarily the same at any particular time. By the time the reference selection logic 340 has finished evaluating the comparator output and has set the capture device 350 to correspond to the evaluated output, the comparator output may have changed. Further, if the reference selection logic 340 attempts to change the output of the capture device 350 before the output of the capture device 350 is sufficiently stabilized to permit evaluation, then race conditions may occur and instead of the desired output, the capture device 350 may produce an output that continuously oscillates between 1 and 0.

The receiver 300 may be configured to address the timing issues regarding the switching of the reference level and the control of the capture device, in part by introducing delay elements to sequence the events and to eliminate the propagation of intermittent states. Delay elements may be introduced, for example, in the deglitcher 330 and the reference selection logic 340. Additionally, the reference selection logic 340 may further address the timing issues by implementing a truth table that determines how the reference generator and the capture device are controlled.

The reference generator 360 is configured to produce the AC and DC reference signals, which determine the reference level of the comparator, based on one or more control signals from the reference selection logic 340. For example, the reference selection logic 340 may select the reference level by sending the digital reference value as a 1-bit control signal, the state of which determines whether the reference generator 360 outputs reference signals that form an upper (e.g., high or positive) reference level or a lower (e.g., low or negative) reference level. The reference levels may be fixed, e.g., set when the receiver 300 is manufactured. Alternatively, the reference levels may be adjustable. For example, the reference generator 360 may generate the reference signals based on programmable settings stored in a hardware register or other memory element in the receiver 300.

FIG. 2 shows a truth table 400 for reference selection in AC mode, according to an embodiment. The table 400 is designed to control a flip-flop with set/reset functionality, but can be modified for other types of capture devices. The table 400 includes, as inputs, the current reference value, the current output of the comparator, and the current output of a capture flip-flop (e.g., the JTAG output). The reference level of the comparator (which is analog) is represented digitally by the reference value, where a reference value of 0 corresponds to the lower of two reference levels (e.g., a low or negative reference level) and a reference value of 1 corresponds to the higher of the two reference levels (e.g., a high or positive reference level). For each input combination, the table 400 provides a corresponding output combination including the next reference value, and set and reset inputs to the capture flip-flop. Regarding the control of the flip-flop, it can be seen that if the current reference value matches the comparator output, the flip-flop will be controlled to match the comparator output. For example, if the comparator output and the current reference value are both 0, the flip-flop is reset. Note that in each of the truth tables described herein, the set and reset inputs are active-low. Thus, "reset_n" equal to 0 means the flip-flop is held in reset state, and "set_n" equal to 0 means the flip-flop is held in set state.

Figure 4:
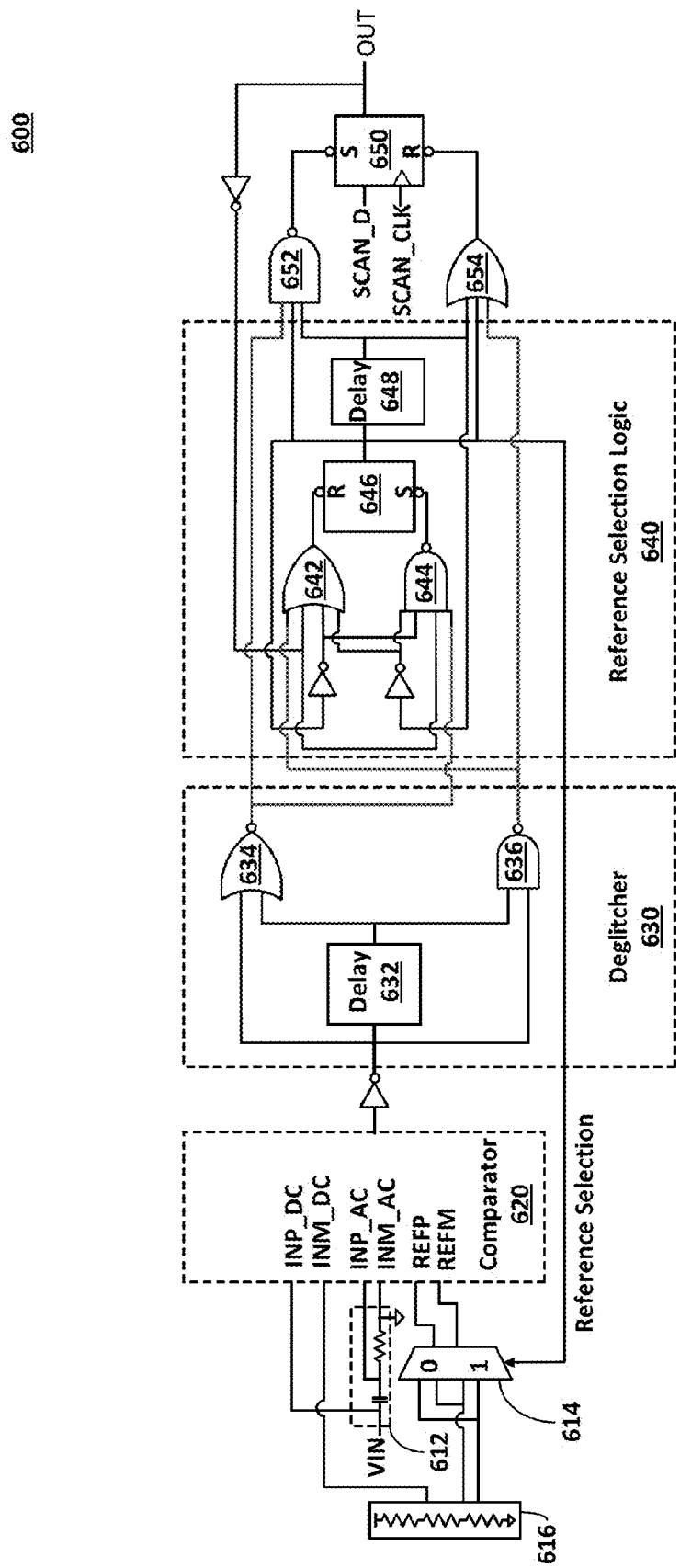
FIG. 4 shows a specific implementation of the test receiver in FIG. 1.

If the current reference value matches the comparator output, then the flip-flop is held in set or reset state, thus disabling the ability to write to flip-flop 650 using data and clock inputs (SCAN_D, SCAN_CLK in FIG. 4). If the current reference value does not match the comparator output, then the next reference value depends on the JTAG output, since the JTAG output might have been updated through the data and clock inputs (SCAN_D, SCAN_CLK), and neither of the set and reset signals are asserted (set_n and reset_n equal to 1) so that the flip-flop 650 will hold its current state unless it is overwritten by the data and clock inputs. Thus, the hold state for the flip-flop 650 is also a write enable state.

Regarding changing the selected reference level, if the current reference value is 0 and the comparator is 1, the next reference value will be changed to match the comparator output (i.e., set to 1) if the JTAG output is 0, but not if the JTAG output is 1. In other words, when the current reference value does not match the comparator output, the next reference value will be set to match the comparator output if evaluation of a historical comparator output (the JTAG output) indicates that the comparator has changed its output value. If the comparator has not changed its output value, then there is no need to change the reference value.

FIG. 3 shows an alternative truth table 500. The table 500 includes an additional input, a delayed output of the comparator. Thus, the table 500 evaluates the comparator output at multiple time points (instantaneous, delayed and historical) in order to determine the next reference value and the state of the flip-flop. If the current reference value, the comparator output, and the delayed comparator output all match, then the flip-flop will be controlled to correspondingly match. For example, the flip-flop will be reset if the reference value, comparator output, and delayed comparator output are all 0. In all other cases, the set and reset signals are not asserted (set_n and reset_n equal to 1) and the flip-flop will hold its current state, unless it is overwritten using the data and clock inputs (SCAN_D, SCAN_CLK).

As for the next reference value, the reference value will be changed if: (i) the current reference value does not match the comparator output, (ii) the comparator output matches the delayed comparator output, e.g., the comparator has held its output at the same value for at least $T_{hyst}$, and (iii) the JTAG output is the same as the current reference value. This is illustrated in rows 510 and 512. Thus, the reference value is changed when the comparator output previously matched the current reference value, but the comparator output has recently changed so that it no longer matches the current reference value, and the comparator has maintained this change for a specified period of time.

FIG. 4 shows a receiver 600, which is a specific implementation of the receiver in FIG. 1. The receiver 600 includes a high-pass filter 612, a reference generator formed by a voltage reference 616, a multiplexer ("mux") 614, a comparator 620, a deglitcher 630, reference selection logic 640, and a capture flip-flop 650. The high-pass filter 612 may be a first order filter including a capacitor in series with a resistor to ground. Alternative high-pass filter designs are possible. The filter 612 provides, at a node where the capacitor is connected to the resistor, a high-pass filtered version of the input "VIN" to the positive AC input INP_AC. The negative AC input INM_AC receives a reference voltage used as an offset voltage for the AC-coupling of VIN. In this instance, INM_AC is tied to ground, but can be set to other voltages, positive or negative, in other embodiments. The filter 612 may provide a direct path between VIN and the positive DC input INP_DC.

The mux 614 includes a first output forming the positive reference signal REFP and a second output forming the negative reference signal REFM. On its input side, the mux 614 receives two voltages from the voltage reference 616 and passes a selected voltage to REFP and another selected voltage to REFM. The comparator 620 derives reference levels from the voltages at REFP and REFM. The reference levels include a positive reference level corresponding to the higher of the two voltages minus the lower of the two voltages, and a negative reference level corresponding to the lower voltage minus the higher voltage. The mux 614 selects the voltages for REFP and REFM based on a control signal from the reference selection logic 640.

The voltage reference 616 may be implemented as a resistor ladder formed by connecting a plurality of resistors in series between a supply voltage (e.g., Vdd) and ground. The resistor ladder may supply a fixed voltage to the negative DC input INM_DC. Alternatively, the resistor ladder may be tapped, e.g., using switches connected at different points along the ladder, to supply a variable reference voltage to INM_DC, e.g., under the control of the reference selection logic.

Deglitcher 630 may receive an inverted output of the comparator 620. The inverted comparator output may be delayed by a delay unit 632, which may be implemented using, for example, a plurality of inverters in series. The delay unit 632 is required for deglitching. The delayed output is an input to a NOR gate 634 and a NAND gate 636. The gates 634, 636 also operate on the inverted comparator output. The output of gate 634 is an input to NAND gate 652. The output of gate 636 is an input to OR gate 654. Gate 652 controls a set input (S) to flip-flop 650. Gate 654 controls a reset input (R) to flip-flop 650.

Flip-flop 650 can be preloaded using a data input "SCAN_D" and a clock input "SCAN_CLK" when its set and reset inputs are high. The output of flip-flop 650 is fed back to the reference selection logic.

Reference selection logic 640 essentially implements the table 500, with additional delay elements to prevent oscillatory behavior. The reference selection logic 640 includes an OR gate 642, a NAND gate 644, an SR latch 646, and a delay unit 648. Unlike flip-flop 650, the SR latch 646 is not clocked. Instead, the SR latch 646 receives a pair of preliminary set and reset signals asynchronously from the gates 642 and 644. It should be noted that, as with the tables 400 and 500, the set and reset inputs to the flip-flop 650 and the SR latch 646 are active-low. As there is more delay in the reference selection logic 640 than in gates 652 and 654, the signals from gates 634 and 636 will cause set or reset pulses to be generated for flip-flop 650 only when: (i) the reference selection (i.e., the output of SR latch 646/input of delay unit 648) and the delayed reference selection (i.e., the output of delay unit 648) are equal, and (ii) the reference selection and the comparator output are equal. Thus, all three values must be 1 for a set pulse to generated, and all three values must be 0 for a reset pulse to be generated. In the case of table 500, there is an additional requirement that the comparator output be equal to the delayed comparator output. While the set and reset pulses are being applied to the SR latch 646, the outputs of gates 634 or 636 propagate through the reference selection logic, eventually changing the reference selection and thus stopping the set/reset pulses at the output of gates 652/654. The output of SR latch 646 provides a control signal by which the mux 614 selects the AC or DC reference level to be used by the comparator 620. Gates 642, 644 each receive an inverted version of the output of SR latch 646, and an inverted version of the output of delay unit 648. The output of gate 636 (in the deglitcher) forms an additional input to gate 642. The output of gate 634 (in the deglitcher) forms an additional input to gate 644.

Delay unit 648 operates to delay the output of SR latch 646, and may be implemented using, for example, a plurality of inverters in series. The output of delay unit 648 forms inputs to gates 652 and 654. The (non-delayed) output of SR latch 646 forms additional inputs to gates 652 and 654. The delay unit 648 should be sized to provide a sufficient delay such that the output of comparator 620 has had time to reflect a change in the reference level caused by a change in the value of the SR latch 646. The delay unit 648 guarantees that no set or reset signals will be applied to flip-flop 650 while the comparator is adjusting to its new reference level. Insufficient delay in unit 648 could result in undesirable oscillations.

In addition to blocking the setting and resetting of the flip-fop 650, the receiver 600 is configured to block changes in the reference value formed by the SR latch 646 until the reference value matches the delayed reference value formed by the delay unit 648. As mentioned earlier, gates 642, 644 each receive an inverted version of the output of SR latch 646 (i.e., the reference value) and an inverted version of the output of delay unit 648 (i.e., the delayed reference value). This logic prevents the SR latch 646 from changing states unless the reference value and the delayed reference value are equal, and is another way in which the receiver 600 is protected against oscillations.

Although the receiver 600 is a single-ended implementation, it can readily be modified to support differential inputs by replicating the comparator, deglitcher, reference selection logic, and voltage reference to form a sub-channel for processing the opposite polarity of a differential input. In that case, the second comparator would perform a separate comparison between the opposite polarity of the differential input and another reference level. The reference level for the first comparator could be the first of two opposing reference levels (e.g., high or positive), while the reference level for the second comparator could be the opposite reference level (e.g., low or negative). Such a differential receiver would include first and second data input pads for receiving the differential input, and first and second data output pads for supplying a differential output to an external device. Each input pad would be connected to the input of a respective comparator, and each output pad would be connected to the output of a respective capture device. In a differential implementation, certain components could be shared. For example, each sub-channel may include its own multiplexer, with both multiplexers sharing access to the voltage reference 616.

Figure 5:
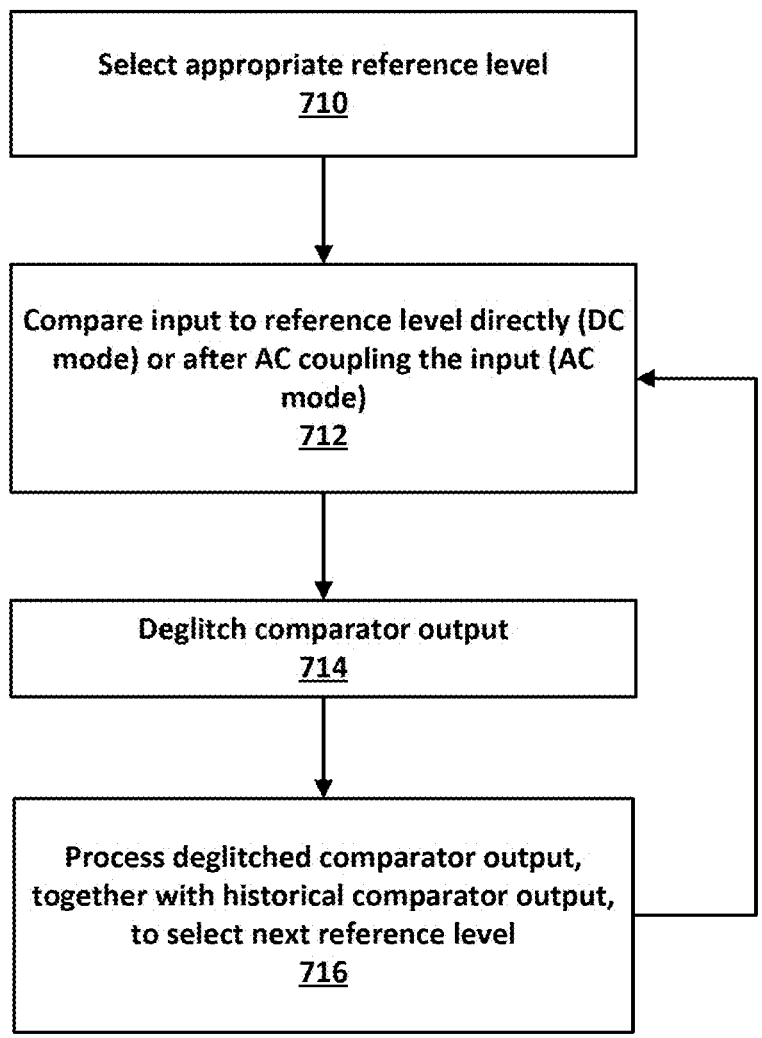
FIG. 5 is a flowchart of a method for receiving data at a test receiver, according to an embodiment.

FIG. 5 is a flowchart of a method 700 for receiving data at a test receiver, according to an embodiment. The method 700 may be performed by a receiver according to the above described embodiments. At step 710, the reference selection logic selects an appropriate reference level for the comparator depending on whether the AC or the DC mode has been selected. If the DC mode has been selected, the comparator will compare the selected reference level directly to the input to perform a level detection (step 712). If the AC mode has been selected, low frequency components are removed from the input using a high pass filter, and the comparator performs an edge detection by comparing the filtered input to the selected reference level.

At step 714, the output of the comparator is deglitched to remove erroneous spikes. The deglitching may introduce a delay and may be performed on a continuous basis, e.g., as long as the receiver is active.

The method continues to step 716, where the reference selection logic processes the deglitched comparator output together with historical comparator output (e.g., the output of a capture flip-flop) to select the next reference level. For example, the reference selection logic may implement one of the truth tables 400 and 500, in which the comparator output, the current reference value, the output of the flip-flop (and in the case of table 500, the delayed comparator output) are inputs to the reference selection logic. If the embodiment of FIG. 4 is used, the delay unit 648 will, as previously explained, introduce an appropriate amount of delay to guarantee the stability of the reference selection by waiting until it is certain that the output of the comparator 620 reflects an earlier change in the reference level before setting or resetting the capture flip-flop. The method then returns to step 712, where a subsequent comparison is performed using the new reference level.

The description of the foregoing embodiments may refer to algorithms, sequences, macros, and operations that require processor execution of instructions stored in memory. One or more processors may collectively or individually execute a computer program stored in memory. Memory may include a non-transitory computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EEPROM), flash memory, and yet other storage such as magnetic or optical cards, or any type of media that stores program instructions. Each of the memory devices may be further connected to a system bus or a network connection, wired or unwired, capable of facilitating or driving communications.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

What is claimed is:

1. A method for processing a boundary scan result, the method comprising:
   receiving the boundary scan result as input data to a comparator, wherein the comparator performs a comparison based on the input data and a selected reference level to form a comparison result;
   setting, resetting or write enabling a capture device that stores the comparison result, wherein the setting, resetting or write enabling is based on the comparison result and a reference value indicating which of two reference levels is the selected reference level; and
   determining whether to change the selected reference level for a subsequent comparison, based on the comparison result, the reference value, and an output of the capture device.

2. The method of claim 1, further comprising:
   operating the comparator in a level detection mode in which the input data is compared directly to the selected reference level.

3. The method of claim 1, further comprising:
   operating the comparator in an edge detection mode in which the input data is transformed through a high-pass filter that removes low frequency components from the input data, and in which the comparator compares the filtered input data to the selected reference level.

4. The method of claim 1, further comprising:
   setting the capture device if the selected reference level is a higher of the two reference levels and the comparison result indicates that the input data is above the selected reference level; and
   resetting the capture device if the selected reference level is a lower of the two reference levels and the comparison result indicates that the input data is below the selected reference level.

5. The method of claim 4, further comprising:
   write enabling the capture device if neither conditions for setting nor conditions for resetting are met.

6. The method of claim 4, further comprising:
   forming a delayed version of the comparison result;
   blocking setting and resetting of the capture device unless the delayed version of the comparison result matches the comparison result; and
   changing the selected reference level only if the delayed version of the comparison result matches the comparison result.

7. The method of claim 4, further comprising:
   blocking setting and resetting of the capture device unless a delayed version of the reference value matches the reference value.

8. The method of claim 1, further comprising:
   changing the selected reference level only if (i) the comparison result does not match the reference value and (ii) the output of the capture device matches the reference value.

9. The method of claim 1, further comprising:
   forming a delayed version of the reference value; and
   changing the selected reference level only if the delayed version of the reference value matches the reference value.

10. The method of claim 1, further comprising:
    receiving the boundary scan result as a differential input that includes, in addition to the data input to the comparator, a second data input to a second comparator, wherein the second comparator performs a comparison using the second data input and a second selected reference level to form a second comparison result;
    setting, resetting or write enabling a second capture device that stores the second comparison result, wherein the setting, resetting or write enabling of the second capture device is based on the second comparison result and a second reference value indicating which of the two reference levels is the second selected reference level; and
    determining whether to change the second selected reference level for a subsequent comparison by the second comparator, based on the second comparison result, the second reference value, and an output of the second capture device.

11. A circuit, comprising:
    a single comparator receiving a boundary scan result as input data, wherein the comparator performs a comparison based on the input data and a selected reference level to form a comparison result;
    a capture device configured to store the comparison result;
    a selection circuit configured to:
       set, reset or write enable the capture device based on the comparison result and a reference value indicating which of two reference levels is the selected reference level; and
       determine whether to change the selected reference level for a subsequent comparison, based on the comparison result, the reference value, and an output of the capture device; and
    a reference generator configured to supply reference signals used to generate the selected reference level for the comparator.

12. The circuit of claim 11, wherein the comparator is configured to operate in a level detection mode in which the input data is compared directly to the selected reference level.

13. The circuit of claim 11, further comprising:
    a high-pass filter that removes low frequency components from the input data, wherein the comparator is configured to operate in an edge detection mode in which the comparator compares the filtered input data to the selected reference level.

14. The circuit of claim 11, wherein the selection circuit is configured to:
    set the capture device if the selected reference level is a higher of the two reference levels and the comparison result indicates that the input data is above the selected reference level; and
    reset the capture device if the selected reference level is a lower of the two reference levels and the comparison result indicates that the input data is below the selected reference level.

15. The circuit of claim 14, wherein the selection circuit is configured to write enable the capture device if neither conditions for setting nor conditions for resetting are met.

16. The circuit of claim 14, wherein:

the circuit forms a delayed version of the comparison result;

the selection circuit is configured to block setting and resetting of the capture device unless the delayed version of the comparison result matches the comparison result; and the selection circuit changes the selected reference level only if the delayed version of the comparison result matches the comparison result.

17. The circuit of claim 14, wherein the selection circuit is configured to block setting and resetting of the capture device unless a delayed version of the reference value matches the reference value.

18. The circuit of claim 11, wherein the selection circuit changes the selected reference level only if (i) the comparison result does not match the reference value and (ii) the output of the capture device matches the reference value.

19. The circuit of claim 11, wherein:

the circuit forms a delayed version of the reference value; and the selection circuit changes the selected reference level only if the delayed version of the reference value matches the reference value.

20. A differential receiver, comprising:

a first data input pad and a second data input pad, wherein the data input pads are configured to receive a differential input;

a first data output pad and a second data output pad, wherein the data output pads are configured to supply a differential output; and a first circuit and a second circuit, wherein the first circuit and the second circuit each comprises:

a single comparator receiving a boundary scan result as input data, wherein the comparator performs a comparison based on the input data and a selected reference level to form a comparison result;

a capture device configured to store the comparison result;

a selection circuit configured to:

set, reset or write enable the capture device based on the comparison result and a reference value indicating which of two reference levels is the selected reference level; and determine whether to change the selected reference level for a subsequent comparison, based on the comparison result, the reference value, and an output of the capture device; and a reference generator configured to supply reference signals used to generate the selected reference level for the comparator;

wherein the input data of the first circuit is connected to the first data input pad, wherein the input data of the second circuit is connected to the second data input pad, wherein the output of the capture device in the first circuit is connected to the first data output pad, and wherein the output of the capture device in the second circuit is connected to the second data output pad.

\* \* \* \* \*